United States Patent [19]

Kelly et al.

[11] 4,445,041
[45] Apr. 24, 1984

[54] ELECTRON BEAM BLANKER

[75] Inventors: John Kelly, Palo Alto; Huei P. Kuo, San Jose; Bernard M. Oliver; Jack D. Foster, both of Los Altos; Wayne C. Haase, Mt. View, all of Calif.

[73] Assignee: Hewlett-Packard Company, Palo Alto, Calif.

[21] Appl. No.: 269,170

[22] Filed: Jun. 2, 1981

[51] Int. Cl.³ .............................................. H01J 37/09
[52] U.S. Cl. .............................. 250/505.1; 250/396 R; 250/398
[58] Field of Search ............... 250/492.2, 492.3, 503.1, 250/505.1, 396 R, 396 MC, 397, 398; 219/121 EV

[56] References Cited

U.S. PATENT DOCUMENTS 3,150,257  9/1964  Wilska ................................ 250/398
4,153,843  5/1979  Pease ............................. 250/396 R

FOREIGN PATENT DOCUMENTS 53-22357   3/1978  Japan ............................. 250/396 R
55-62730   5/1980  Japan ............................. 250/396 R
56-91423   7/1981  Japan ............................. 250/396 R
439414    12/1935  United Kingdom .
1269156    4/1972  United Kingdom .
1544222    4/1979  United Kingdom .
1557924   12/1979  United Kingdom .
1567187    5/1980  United Kingdom .

Primary Examiner—Alfred E. Smith
Assistant Examiner—Carolyn E. Fields
Attorney, Agent, or Firm—Joseph H. Smith

[57] ABSTRACT

An electron beam blanker for use in electron beam lithography systems is disclosed which is capable of providing exposure rates on the order of 300MHz at beam currents of approximately 600nA. A condensing lens and a stigmator are provided to bring the electron beam to a small image in a plane perpendicular to the beam direction. An etched silicon knife-edge, coated with gold, is located in this image plane in close proximity to the beam, to provide a sharp cut-off as the beam is swept past its edge. In accordance with aspects of the invention, a deflector plate structure provides an electromagnetic field whose geometry ensures that the velocity of a beam electron, as it exits the field, is substantially directly proportional to the undeflected beam electron's position vector relative to the beam crossover in the image plane of the condenser lens. Since the image plane of the condensing lens becomes the object plane for a final lens which forms the spot on a point on the resist, the above geometry substantially eliminates spot motion during the blanker rise time.

8 Claims, 5 Drawing Figures

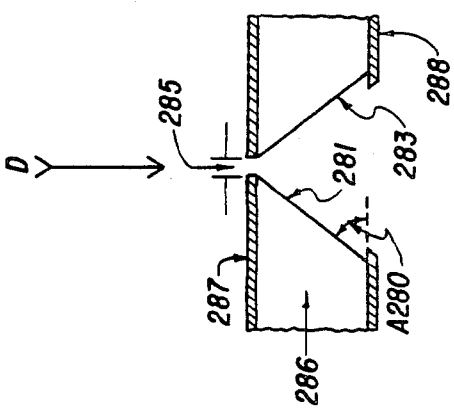
FIGURE 5 (KNIFE EDGE 280)
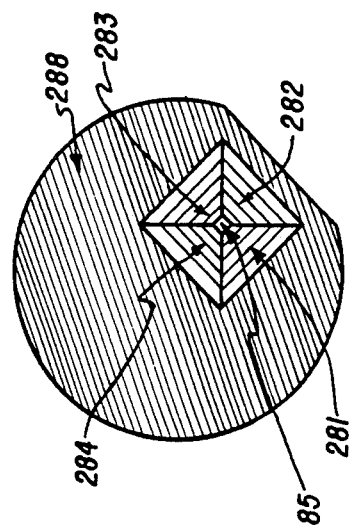
FIGURE 4 (KNIFE EDGE 280)
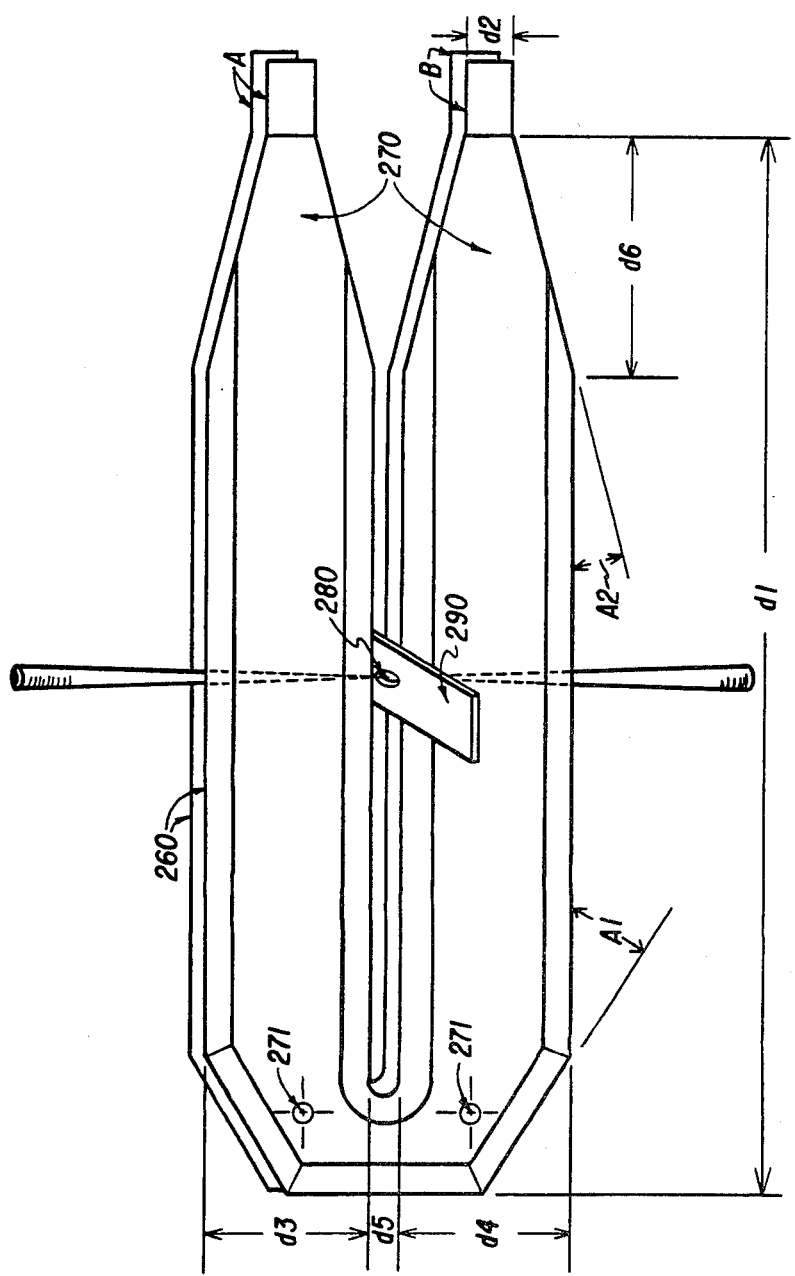
FIGURE 2 (BLANKER 25)

ELECTRON BEAM BLANKER

BACKGROUND OF THE INVENTION

With the increasing demand for high performance integrated circuits, the techniques of microfabrication have been undergoing continuous development and now include the use of scanning-type electron beam lithography systems, both for producing high quality photolithographic masks and for direct pattern generation. A typical integrated circuit design contains a vast amount of information, particularly if the patterns involved are very finely detailed. For example, it requires $2 \times 10^8$, 5 $\mu$m squares to cover a mask of approximately 50 cm$^2$. Even at a writing density of only 25%, this would require the drawing of at least $5 \times 10^7$ individual squares. At typical exposure rates of the order of 1 cm$^2$/min., this would result in 12 minutes of beam exposure time alone, notwithstanding other times required for production such as alignment, calibration, data processing and developing, etching, and stripping of resist material from the mask. With these latter times included, typical processing times often exceed an hour. In addition, more detailed patterns which take maximum advantage of electron beam capabilities further increase the time required.

In direct pattern generation, where the electron beam system creates a pattern directly on a chip covered with resist material, the often complicated and time consuming mask-making process is eliminated. However, one of the key economic considerations in an electron beam system in a production environment is the throughput achieved by direct writing relative to a system using a series of masks, especially since direct writing is necessarily a series output process. Hence, time constraints become even more critical in direct pattern generation.

The rate at which a pattern can be exposed (i.e., the exposure time per pixel) is limited by several factors, including the sensitivity of the resist relative to the beam current density, the speed of the table carrying the substrate, the maximum spot size, the ability to deflect the beam at high speed, the data rate of the computer systems, and, in raster scan systems, the blanking time (i.e., the time to turn the beam on and off). Each of these parameters has been the subject of extensive investigations in recent years, and significant advances have been made in each. For example, high sensitivity electron resists are now readily available, computer systems have seen major advances in speed, exotic control systems have been developed to increase speed and to accurately monitor substrate table motion, and beam blanking times have been measurably reduced.

However, as ever higher writing speeds have been sought, other significant problems have also appeared, often as a result of the relationship among these various parameters. For example, as the writing speed increases, the current density must be increased to maintain the same exposure on the resist. However, higher current densities lead to beam broadening due to electron-electron interactions, thereby deleteriously increasing the line width. Also, a shortened exposure time further requires a shortened blanking time, since the rise time of the blanker is closely related to the accuracy of the exposure of each pixel, and is also a major concern in avoiding extraneous exposure during blanking. Hence, blanking time in raster scan type electron beam devices remains one of the key factors limiting throughput.

Most commonly, blankers in these devices consist of two electrostatic deflector plates which deflect the beam off the central axis onto an aperture stop located beyond the deflector plates, thereby turning the beam off. The beam is turned on when the deflector plates are no longer charged, permitting the beam to pass through the aperture. The location of the deflector plates varies from one device to another depending on the particular configuration of the electron beam column. One common configuration is to image the electron source with a condenser lens, and to locate the deflector plates symmetrically relative to the image plane (i.e., at an electron beam cross-over) as in the EBES (electron beam exposure system) developed at Bell Telephone Laboratories. In the limiting case where each electron sees a constant electric field as it traverses the deflector plates, this symmetric arrangement ensures that the writing spot does not moving during blanking, since the undeflected beam cross-over becomes the center of deflection, and is the optical conjugate of the writing spot on the resist. Hence, at low data rates where the blanker rise time can be slow compared to the time for an electron to traverse the deflector plates, the electrons see an essentially constant field and there is very little motion of the writing spot during blanking. In this case, blanker rise time is determined primarily by the required exposure accuracy.

This limiting case is closely approximated by the EBES type systems, where exposure times are generally on the order of 0.025 $\mu$sec. to 0.1 $\mu$sec. (i.e., a data rate of up to 40 MHz) at beam currents on the order of 20 nA. At an electron energy of 20 KV and deflector plates approximately 4 cm. in length, the transit time for an electron between the deflector plates is of the order of 0.5 nanosecond, while a typical blanker rise time is of the order of 10 nanoseconds to ensure exposure accuracy. Under these conditions, field variations seen by an electron during transit between the deflector plates are of the order of 5%. Hence, there is very little spot motion on the resist during the blanker rise time. Also, with the blanker rise time being short relative to the exposure time, what little spot motion there is does not cause problems with extraneous exposure.

However, it is apparent that at significantly higher exposure rates, the EBES type systems would encounter serious difficulties. For example, an exposure rate of 300 MHz would correspond to exposure times of the order of 3.3 nanoseconds for the same or similar resist, and beam currents of the order 600 nA. Such an exposure time would place extraordinary demands on the blanker system since, at this high data rate, there would be substantial beam motion during the blanker rise time which could cause extraneous exposure. Typically, if the limit on extraneous exposure is set at approximately 1%, the blanker rise time will also be on the order of 1% of the exposure time, corresponding to a 33 picosecond blanker rise time for a 3.3 nanosecond exposure time. Furthermore, the aperture stop in the EBES type systems typically has a pass aperture of approximately 10 times the beam diameter, thereby avoiding charging effects. However, blanking then requires the beam to be deflected a distance on the order of 10 diameters to avoid exposing the resist. For this geometry, a lateral deflection of the beam by 10 beam diameters corresponds to an angular deflection of 10 times the beam full-angle, and requires relatively large electric fields.

Such blanker rise times at the voltages required for blanking on an aperture stop have not heretofore been achieved in raster scan type electron beam lithography devices.

SUMMARY OF THE INVENTION

In accordance with the illustrated preferred embodiments, the present invention provides an electron beam lithography device with an electron beam blanker geometry which enables the device to achieve data rates up to 300 MHz and perhaps higher. Unlike the devices described in the Background, the electron beam blanker does not use a blanker stop remotely located from the deflector plates. Instead the blanker stop, or knife edge, is located within the deflector plate structure.

A condensing lens and a stigmator are provided to bring the electron beam to a small image in a plane perpendicular to the beam direction. The knife edge is located in the image plane in very close proximity to the beam in order that the beam deflections required for blanking remain very small. In accordance with aspects of the invention, the deflector plate structure provides an electromagnetic field whose geometry ensures that the velocity of a beam electron, as it exits the field of the deflector plate structure, is substantially directly proportional to the beam electron's position vector relative to the undeflected beam cross-over in the image plane of the condenser lens. Since this image plane becomes the object plane for the final lens which forms the image (or spot) at a point on the resist below, the above geometry substantially eliminates spot motion during beam blanking, because all electrons which do not get blanked appear as if they originated from the undeflected beam cross-over (i.e., the center of deflection remains at the undeflected beam cross-over during blanking).

Further, in a first embodiment of the deflector plate structure, the geometry provides a delay in the electromagnetic field in order to essentially match the phase velocity of the electromagnetic field with the velocity of electrons in the beam, i.e., the plates form a slow wave transmission line. Ideally, with a deflector plate structure which is symmetric with respect to the image plane of the condenser lens, this matching of the electron's passage through the structure with that of the electrical signal would ensure that each electron sees a constant electric field perpendicular to the beam direction as it traverses the deflector plate structure, thereby substantially eliminating spot motion during the blanker rise time. However, in practice a perfect slow wave structure is not achievable and structures approaching the ideal can be quite complicated. In answer to this problem, a particularly simple geometry for a slow wave structure has been developed which can be optimized to substantially eliminate spot motion on the target during blanking.

In a second embodiment of the deflector plate structure, the geometry has been configured simply as a delay line. This configuration also ensures that an electron will see essentially the same electromagnetic field above the knife-edge as it sees below the knife-edge, again with a proper delay to provide the required relationship between the position and velocity of the electron as it exits the structure so that the center of deflection remains at the undeflected beam cross-over.

Furthermore, by substantially eliminating spot motion during blanking, the primary constraint on blanker rise time is no longer determined by the problem of extraneous exposure. Instead, it is determined by exposure accuracy. This substantially relaxes the speed requirements for the blanker so that the blanker rise time can be as much as one-third of the required exposure time per pixel or even larger depending on the edge definition desired for the exposure. Hence, for beam currents of 600 nA at an exposure rate of 300 MHz, the blanking time can be on the order of as much as 1 nanosecond, instead of on the order of picoseconds. It should be noted, however, that having eliminated many of the geometrical complications effecting extraneous exposure, the exposure of a particular pixel is still determined by the point in time at which the beam crosses the knife-edge, and, hence, continues to be dependent on the stability, noise, and jitter in the blanker driver electronics.

BRIEF DESCRIPTION OF THE DRAWINGS

FIG. 2 illustrates the details of the first preferred embodiment of a device according to the invention.

FIG. 4 shows a view of a knife-edge blanker stop from below.

FIG. 5 shows a view of the knife-edge in cross-section.

DETAILED DESCRIPTION OF THE INVENTION

Figure 1:
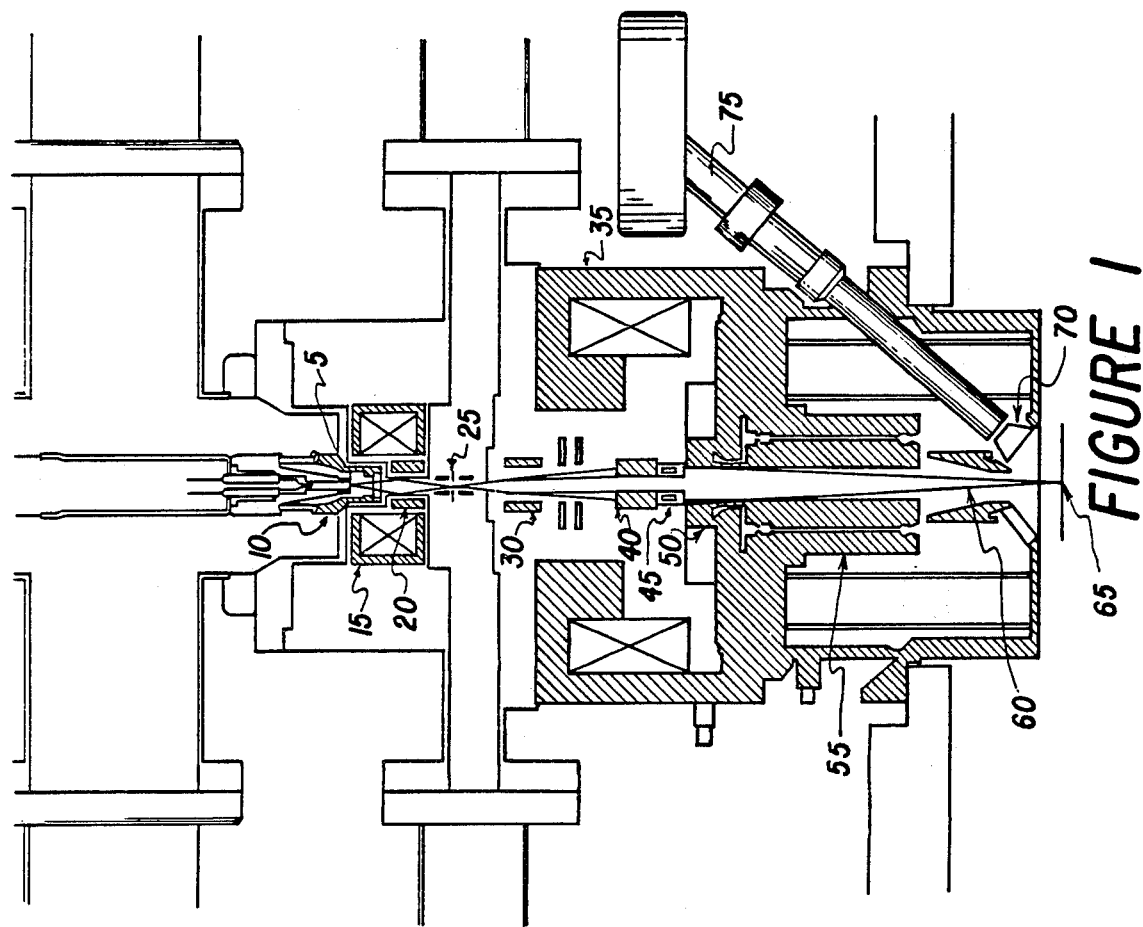
FIG. 1 shows the general configuration of the column of an electron beam lithography device.

For a general understanding of the invention, it is helpful to see the relationship of the blanker to the other elements of an electron beam lithography column. To that end, FIG. 1 is provided as an example of a typical electron beam lithography column depicting the relative position of the blanker in the device.

Electrons are provided in the column by a cathode 5 which is a Zirconiated-Tungsten field emission electron source much as described in U.S. Pat. No. 3,374,386 entitled FIELD EMISSION CATHODE HAVING TUNGSTEN MILLER INDICES 100 PLANE COATED WITH ZIRCONIUM, HAFNIUM OR MAGNESIUM ON OXYGEN BINDER, issued to Charbonnier, et al., in 1968. Cathode 5 is supported above an anode 10, with the anode serving to control and effectively collimate the beam, thereby providing a well defined beam half-angle. Generally, electrons enter the column through an aperture in the anode at an energy of approximately 20 KV.

As the electrons move down the column from the anode, they encounter a first lens 15 which serves to focus the beam at the center of a blanker 25. Along that path, an alignment deflector/stigmator 20 aligns the beam with the optic axis and stigmates the beam to provide the proper shape before the electrons enter the blanker. Blanker 25 then blanks the beam at the appropriate time to control the exposure on a target 65 below. A second alignment deflector 30 is also provided to realign the beam after it has passed through blanker 25.

Following realignment, the beam enters a final lens 35 which focuses it onto target 65, the object point of the final lens 35 being the beam cross-over at the center of the blanker. Another element 40 is located within final lens 35, serving as a third alignment deflector and second stigmator. This element is used to compensate for aberrations in final lens 35, and is especially important in providing an astigmatism free system below the beam cross-over. The next element down the column is a dynamic focus coil 45. This small coil on the optic axis serves as a fine focus for beam 60 as it is being deflected to the appropriate location on the target by a high speed deflector 50 and a precision deflector 55. Element 70 is an electron scintillator which is connected to a light pipe and photomultiplier 75, which are used to accurately monitor the device as it is writing.

In FIG. 2 is shown a configuration of the blanker according to the invention as it is arranged with the first embodiment of the deflection plates. The electromagnetic field for deflecting the beam is provided by a slow wave transmission line structure having two identical, vertically aligned, gold plated, beryllium-copper plates 260 which are spaced apart 0.10 inches, each plate having the general shape of a "U" and being symmetric, top to bottom (i.e., having reflection symmetry in a horizontal plane through the midline of the device). Electromagnetic energy enters this slow wave structure as a rectangular waveform from an external computer-controlled current source (not shown) through the two leads at point A; traverses a transition region which flares out from the narrow width of the leads to the full width of the plates; travels the length of the U on the top half; is reflected around the corner; travels back the length of the U on the bottom half; traverses another transition region identical to the first; and exits the leads at point B. The dimensions of the blanker plates in this embodiment have been chosen to provide a maximum plate area in the given space available in the column.

Typically, the length of the blanker, d1, is 3.380 inches and is determined primarily by the desired electrical path length. Angle A1 is the result of truncating right angle corners to eliminate reflections, and was found experimentally to be optimized at approximately 32 degrees. Similarly, angle A2 was chosen as approximately 15 degrees. Also the edges of the plates have been chamferred at approximately 30 degrees to reduce field fringing effects, an especially important feature to eliminate cross-talk between the input portion and the output portion of each plate, due to their relatively small separation, d5 (=0.094").

The plates have a constant thickness of 0.063 in., except in the transition regions 270 where, to maintain a constant 50 ohm impedance, they flare out from 0.063 in. to 0.099 in. where they abut the leads. The transition regions 270 are trapezoidal in shape in the planes of the plates, with the base of the trapezoid matching the 0.550 in. width of the plates, d3 and d4, while the width of the top of the trapezoid matches the 0.150 in. width of the leads, d2. The height of the trapezoid corresponds to the length of the transition region, d6, and has been chosen as approximately 0.743 in. to avoid reflections back up the line.

In order to stop the electrons which are deflected by the plates, a knife-edge 280 is suspended between the plates close to the center of the U by a knife-edge support 290, with the orientation of the knife-edge being perpendicular to the planes defined by the plates. Typically, the precise position of the knife-edge support is chosen to provide an electrical path length of 7.49 cm from the knife-edge, around the bend in the U, and back to the knife-edge. The transit time associated with the electromagnetic wave on this path corresponds approximately to the time for an electron in the beam to traverse the width of the top half of the plates, d3, and half of the gap, d5, i.e., the average phase velocity of the electromagnetic wave is approximately the same as the electron velocity. By providing this delay in the electromagnetic field from the top half of the plates to the bottom half, an electron entering the blanker will see substantially the same field above the beam cross-over as it does below it, but delayed in time, and the center of deflection will remain at the undeflected beam cross-over. This is a key element in eliminating spot motion during the rise time of the electromagnetic field (i.e., the blanker rise time). It should be emphasized, however, that the electron velocity and the average phase velocity of the electromagnetic field are only approximately equal since the electrical path length has purposely been made longer than that required to to match these velocities precisely in order to compensate for the fact that the deflection plates do not form a perfect slow wave structure. In practice, the precise delay (i.e., the electrical path length) required is calculated by means of an optimization scheme which computes the center of deflection for electrons passing through the structure at different phases with respect to the electromagnetic wave traversing the deflector plates.

As indicated earlier, the particular geometry of this first embodiment has been chosen to maintain a constant impedance throughout the structure in order to obtain the high frequency response which is required. So too, any mounting devices to hold the plates firmly in place should not seriously change that impedance. In this embodiment, the deflector plates 260 are mounted in the column by electrical leads A and B, and by two mounting holes 271 which are located on each plate. Typically a metal screw is inserted through each hole 271, and is connected to a cylindrical metal stand-off. This stand-off is designed to provide a low capacitance mount to one end of a ceramic post which insulates the deflector plate structure from other conductors in the column. Typically, the other end of the ceramic post is connected to the column by means of another low capacitance metal stand-off.

Figure 3:
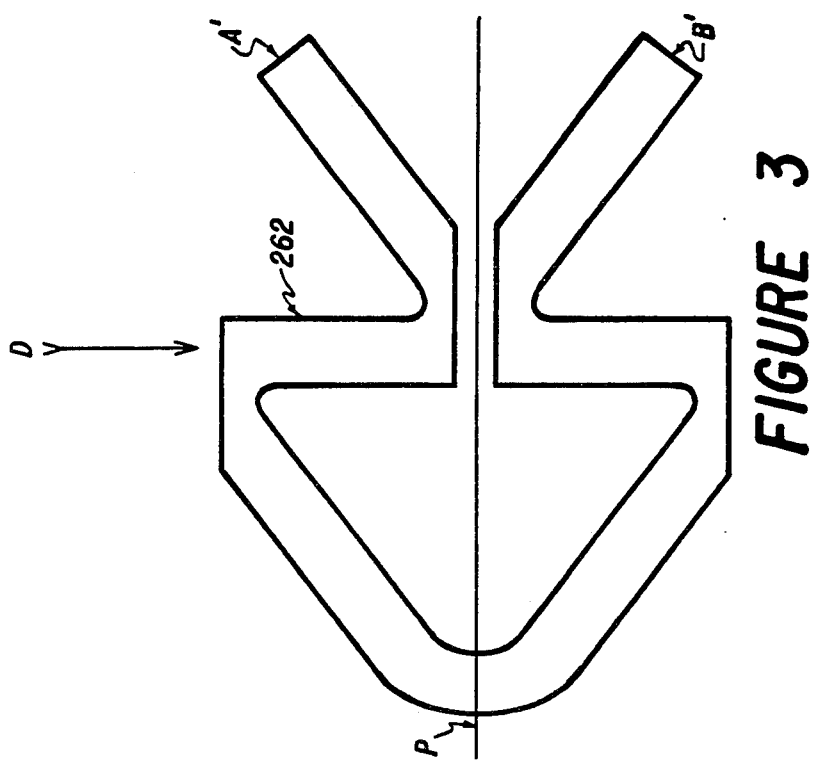
FIG. 3 shows a second preferred embodiment for the blanker plate structure.

In FIG. 3 is shown a second embodiment for the shape of the deflector plates, which is configured as a delay line. In operation, the blanker would be made up of two such plates 262, which are parallel to one another and spaced apart at a distance designed to provide the desired impedance. In this configuration, direction D represents the direction of the electron beam, and plane P is the plane of symmetry of the plates where the knife-edge is located. Electromagnetic energy is fed into the structure at point A', and substantially interacts with the electron beam only in the vertical sections where the electromagnetic wave is traveling in the vertical direction, eventually exiting the structure at B'. This structure has the advantage that both the electric and magnetic fields contribute in the same direction to the blanking deflection, thereby providing increased sensitivity relative to that of the first embodiment. End effects are more pronounced, however.

As in the first embodiment, the length of the delay line in this second embodiment is chosen such that the time for the electromagnetic wave to traverse the structure from point A' to plane P is approximately equal to the time required for an electron in the beam to move from the top of the structure to plane P. It should be noted that with this geometry, the phase velocity of the electromagnetic wave is not equal to the electron velocity, but in fact is in the opposite direction, in contradistinction to that of the first embodiment.

Both of the above embodiments provide an impulse to the electrons in the beam such that for those electrons which are not completely blanked, as happens during the blanker rise time, the velocity of an electron as it exits the deflector plate structure is substantially proportional to the position vector of the electron relative to the undeflected beam cross-over. Since the object plane of the final lens is at the undeflected beam cross-over, the above relationship between the position vector and the velocity vector of the electron will substantially eliminate spot motion on the resist below, during the blanker rise time (provided, of course, that the column is astigmatism free below the undeflected beam cross-over). Although both of the above embodiments have reflection symmetry in the image plane of the first lens 15 in the region of interaction with the electron, this symmetry is not required to achieve the desired result. In fact, for the fast blanker rise times associated with the above embodiments, such symmetry is not even a sufficient condition unless the geometry of the blanker also provides the proper delay in the propogation of the electromagnetic field from the top portion of the structure to the bottom. This feature is quite distinct from the slower prior art blanking systems where such structural symmetry relative to the beam cross-over virtually assured little or no spot motion on the resist below during the blanker rise time. Other embodiments which are not symmetric are therefore also possible. For example, the desired relationship between the velocity and the position of an electron in the beam could be obtained with two separate pairs of deflector plates, one pair above the beam cross-over and the other pair below the beam cross-over, with each pair being driven by a separate amplifier and providing a different field strength. Of course, the outputs of these amplifiers would need to be properly sequenced to provide the appropriate time delay from top to bottom.

The specific details of the geometry of the knife-edge 280 are shown in FIGS. 4 and 5. Generally, the knife-edge is constructed by the anisotropic etching of a hole 285 through a single crystal silicon wafer 286 of (100) crystal orientation. The resulting structure is a well defined, truncated, square pyramidal cavity bounded by the four convergent (111) planes, 281, 282, 283, and 284. FIG. 4 provides a view of this pyramidal structure from below, while FIG. 5 shows a cross-section through the cavity oriented as it would be in the electron beam column. The direction shown by arrow D represents the direction of the incident electron beam and also corresponds to the (100) direction of the crystal. Angle A280 is characteristic of the crystalline structure and is equal to 54.74 degrees.

Following construction of hole 285, the silicon wafer 286 is coated with gold layers 287 and 288 to ensure that impinging electrons are stopped. Then, when the beam is swept past the sharp edge of the hole onto the wafer, a well-defined cut-off is provided.

Typical dimensions are 0.020 in. thick for the silicon wafer, approximately 0.1 mm square for the hole, and approximately a 1000 Å coating of gold. Furthermore, it is important that the gold not be so thick as to destroy the sharpness of the knife-edge, since a well defined edge is critical to the principle of operation.

In practice, the top plane of the wafer is located at the beam cross-over (produced by the first lens 15 of FIG. 1), where the beam is on the order of only a tenth of a micron in diameter. In order to provide symmetric switching between beam off and beam on, the position of the knife-edge in the horizontal plane at the beam cross-over is half-way between the position of the beam at maximum deflection and the position of the beam at zero deflection. Further, due to the small diameter of the beam at the cross-over, the knife-edge can be located as close as 3 μm from the undeflected beam, and still have adequate separation between the beam and the knife-edge to allow for mechanical tolerances and electrical instabilities. In this implementation, the required voltage for beam blanking is approximately 6 volts. By comparison, an otherwise identical device using an aperture-stop as in the EBES configuration instead of a knife edge at the beam cross-over, would require a minimum of 36 volts between the plates to blank the beam.

The importance of the ability to use rather small voltages to blank the beam should be readily apparent when one considers that the blanker rise times required for accurate pixel exposure at beam currents of the order of 600 nA are on the order of one nanosecond even with the new geometry disclosed herein. This is already difficult to achieve at these rather low voltages with state-of-the-art electronics, without having to produce the higher voltages and shorter rise times required for accurate exposure using the standard deflector plate aperture-stop geometry.

What is claimed is:

1. A beam blanking device for selectively interrupting the flow of electrons in an electron beam, said beam having an initial beam direction defined by the direction of the beam before entering the beam blanking device, comprising:

focusing means for focusing the electron beam, providing an undeflected beam cross-over at an image plane which is substantially orthogonal to the initial beam direction;

electromagnetic field means for providing an electromagnetic field to deflect electrons in the electron beam from the initial beam direction, said electromagnetic field means having at least two parallel, spaced-apart, conducting plates with an orientation such that the electron beam traverses a path therebetween, said said plates substantially parallel to said initial beam direction, and said electromagnetic field means further comprising slow-wave transmission line means, of which said plates are a portion thereof, for providing an average phase velocity of said electromagnetic field which is approximately the same as the velocity of the electrons in the electron beam;

knife-edge means, located substantially within said image plane for stopping the flow of those electrons deflected sufficiently far to impinge on said knife-edge means;

said plates arranged such that an electron which is deflected but is not stopped by said knife-edge means, exits said plates with a velocity vector substantially proportional to its position vector relative to said undeflected beam cross-over.

2. A device as in claim 1 wherein each plate of said slow-wave transmission line means is generally U shaped, with said U shape being oriented so that one side of said U lies above said image plane and the other side of said U lies below said image plane.

3. A device as in claim 2 wherein said knife-edge means comprises a semiconductor chip having an etched tapered hole, defining at least one sharp, straight edge on said chip.

4. A device as in claim 3 wherein said semiconductor chip is coated with a conductor.

5. A device as in claim 4 wherein said semiconductor chip is comprised of silicon.

6. A device as in claim 5 wherein said conductor is comprised of gold.

7. A device as in claim 1 wherein each of said plates is symmetric in reflection with respect to said image plane.

8. In a beam blanking device for interrupting the flow of electrons in an electron beam, a knife-edge for stopping the flow of electrons deflected sufficiently far to impinge on said knife-edge, comprising:
- a semiconductor chip having an etched tapered hole defining at least one sharp, straight-edge on said chip;
- said semiconductor chip coated with a conductor.

* * * * *